United States Patent [19]

Dishal

[11] 4,298,841
[45] Nov. 3, 1981

[54] SIGNAL ENVELOPE DETECTING SYSTEM

[75] Inventor: Milton Dishal, Clifton, N.J.

[73] Assignee: International Telephone and Telegraph Corporation, New York, N.Y.

[21] Appl. No.: 75,616

[22] Filed: Sep. 14, 1979

[51] Int. Cl.³ .................. H03K 5/24; H03K 5/153
[52] U.S. Cl. ................................ 328/117; 307/351; 307/360; 328/135; 328/147; 328/150
[58] Field of Search ............. 307/350, 351, 360, 361; 328/116, 117, 135, 139, 147, 150

[56] References Cited

U.S. PATENT DOCUMENTS 2,927,207  3/1960  Fiehrer et al. .................... 328/116
3,431,497  3/1969  Manley .......................... 328/116 X
4,117,418  9/1978  Höglund ......................... 330/295 X Primary Examiner—John Zazworsky
Attorney, Agent, or Firm—John T. O'Halloran; Alfred C. Hill

[57] ABSTRACT

A plurality of amplitude detectors are employed to detect the envelope of a signal requiring accurate reproduction over a large dynamic range with each of the plurality of detectors being rendered operative one at a time to detect the amplitude of the signal in a different amplitude range of the signal and the others of the detectors not being rendered operative are held inoperative. The output signal of the plurality of detectors when they are rendered operative are coupled to a combining point.

16 Claims, 3 Drawing Figures

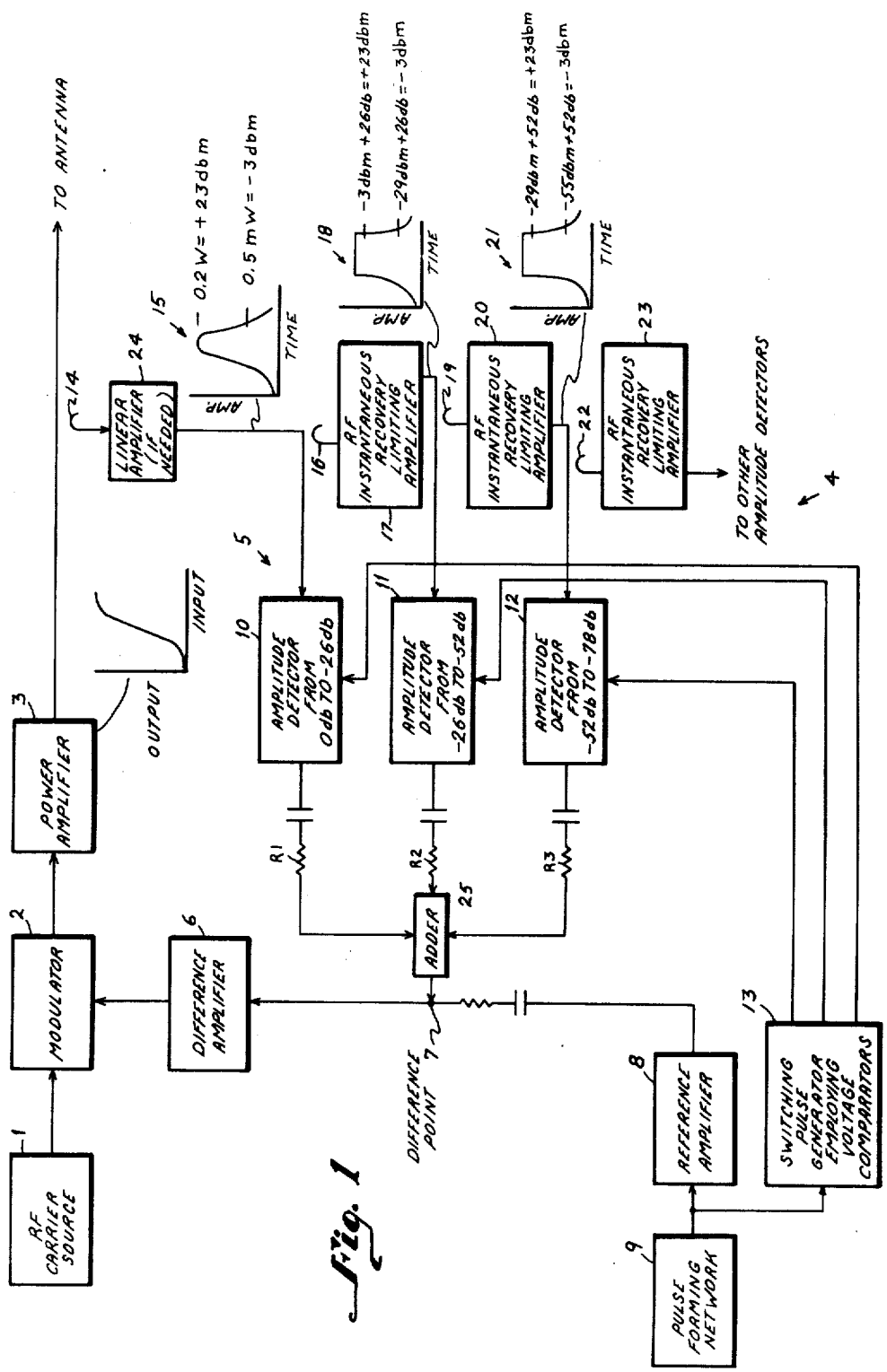

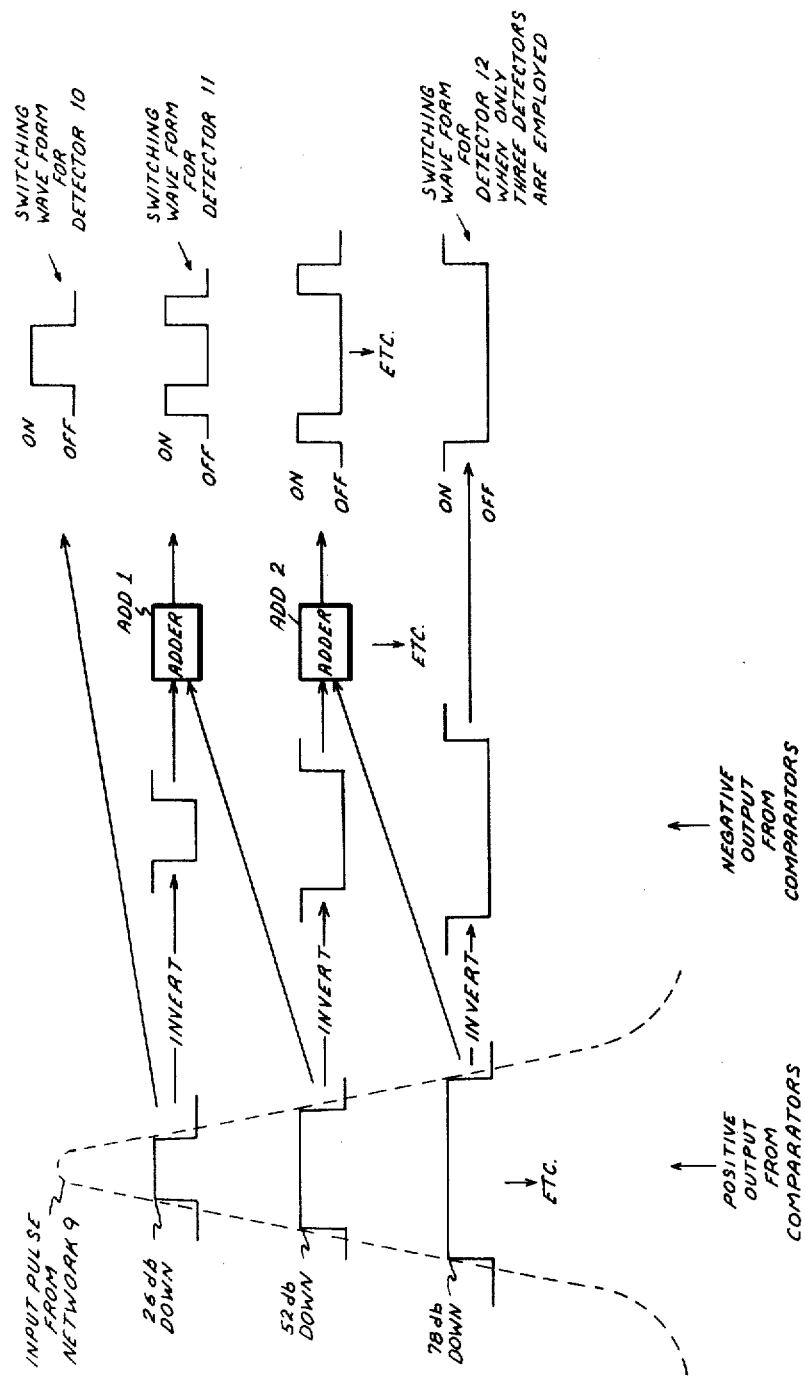

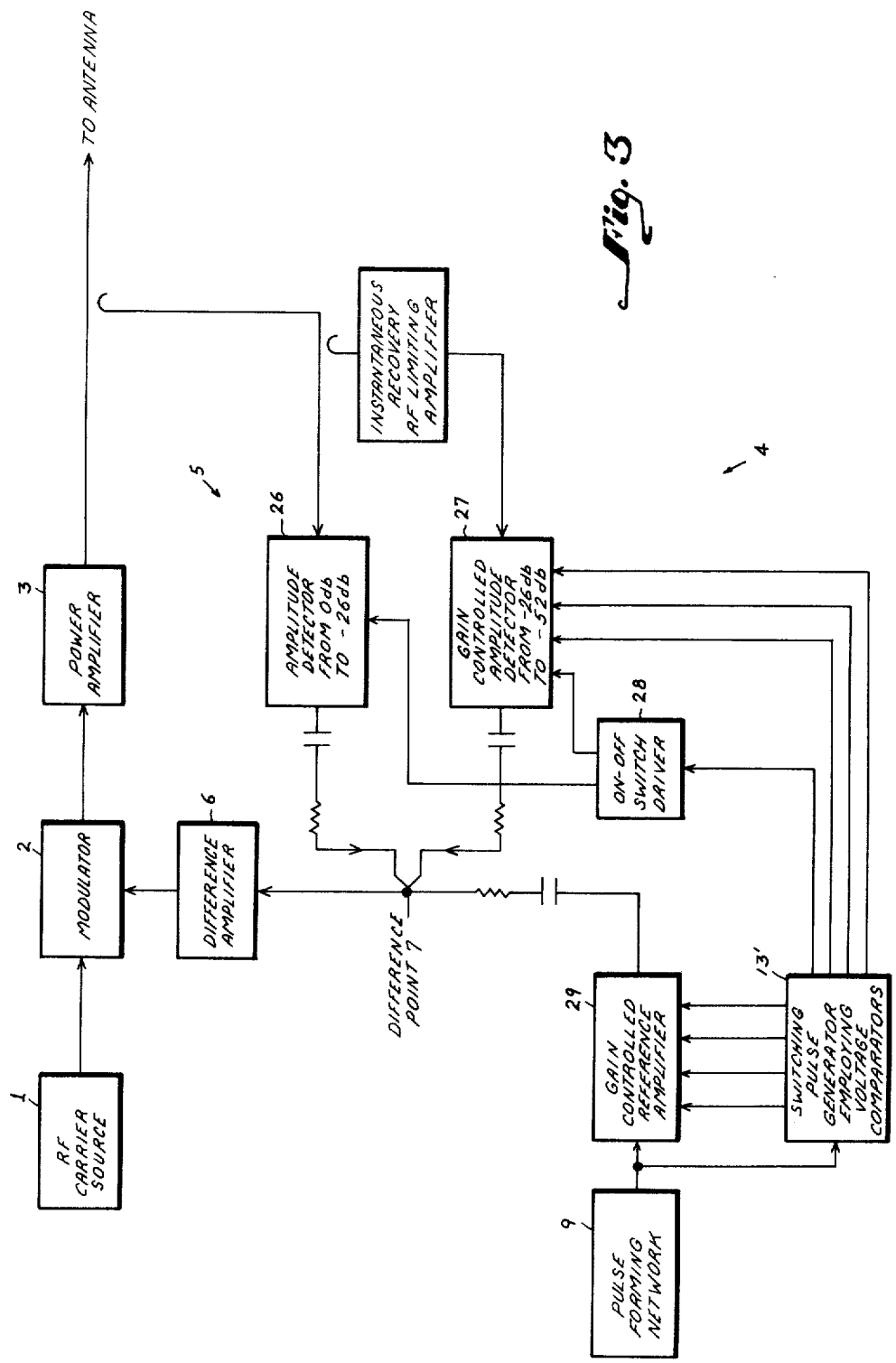

SIGNAL ENVELOPE DETECTING SYSTEM

BACKGROUND OF THE INVENTION

The present invention relates to signal envelope detectors and more particularly to a signal envelope detecting system for detecting the envelope of a signal requiring accurate reproduction over a large dynamic range.

It has been found that a single signal envelope detector to detect the envelope of a signal requiring accurate reproduction over a large dynamic range results in amplitude distortion of the detected envelope at low signal levels together with improper loop gain when such an envelope detector is employed in a feedback loop.

SUMMARY OF THE INVENTION

It is an object of the present invention to provide a signal envelope detecting system for detecting the envelope of a signal requiring accurate reproduction over a large dynamic range which overcomes the disadvantage of a single envelope detector.

A feature of the present invention is the provision of a signal envelope detecting system for detecting the envelope of a signal requiring accurate reproduction over a large dynamic range comprising: a source of the signal; a plurality of amplitude detectors coupled to the source, each of the plurality of detectors being rendered operative one at a time to detect the amplitude of the signal in a different amplitude range of the signal and the others of the plurality of detectors not being rendered operative are held inoperative; and means coupled to the output of the plurality of detectors to receive the output signals therefrom.

BRIEF DESCRIPTION OF THE DRAWING

Abovementioned and other features and objects of this invention will become more apparent by reference to the following description taken in conjunction with the accompanying drawing, in which:

FIG. 1 is a block diagram of a transmitter employing a first embodiment of the signal envelope detecting system in accordance with the principles of the present invention;

FIG. 2 is a diagram illustrating the generation of switching waveforms generally and more particularly for the three detector system of FIG. 1; and FIG. 3 is a block diagram of a transmitter employing a second embodiment of the signal envelope detecting system in accordance with the principles of the present invention.

DESCRIPTION OF THE PREFERRED EMBODIMENTS

Referring to FIG. 1, the transmitter includes an RF (radio frequency) carrier source 1 which is coupled to a modulator 2 whose output is coupled to a power amplifier 3 which has a Class C or other non-linear input-output characteristic. The RF drive to power amplifier 3 is controlled by a feedback loop 4 incorporating the first embodiment of a signal envelope detecting system 5 in accordance with the principles of the present invention. The output of system 5 is coupled to a difference amplifier 6 to provide the modulated signal through modulator 2 for power amplifier 3, thereby completing feedback loop 4. The output signal of system 5 is coupled to a difference point 7 which is subtracted from the output of a reference amplifier 8 which amplifies a reference signal in the form of a desired wave produced in the desired wave forming network 9. The resultant signal at point 7 is the input signal for difference amplifier 6.

Signal envelope detecting system 5 includes a plurality of amplitude detectors, three of which are shown in FIG. 1, namely, amplitude detectors 10–12. It is to be understood that more than three amplitude detectors can be employed if it is desired to detect the envelope of a signal at an even greater number of decibels (db) below its peak level than the −78 db of the example to be described. As illustrated, the three amplitude detectors 10–12 respond to the amplitude of the signal in three different sequential amplitude ranges. For instance, amplitude detector 10 is rendered operative by a control pulse from switching pulse generator 13 in the 0 db to −26 db below peak input amplitude range, amplitude detector 11 is rendered operative by another control pulse from generator 13 in the amplitude range of −26 db to −52 db below the peak input and amplitude detector 12 is rendered operative by yet another control pulse from generator 13 in the amplitude range of −52 db to −78 db below the peak input. The control pulses from generator 13 are such that when one of the amplitude detectors 10–12 are rendered operative the other amplitude detectors are rendered inoperative. The three control pulses produced by generator 13 are provided by correctly differencing the output of three different voltage comparators as illustrated in FIG. 2. In the arrangement illustrated each voltage comparator is triggered when the amplitude of the pulse from network 9 reaches that voltage level corresponding to a boundary of the associated amplitude range, namely, in the example illustrated, at −26 db, −52 db, and −78 db below the peak level.

A typical schematic diagram for amplitude detectors 10–12 is fully disclosed in FIG. 6 of the co-pending application of M. Dishal, Ser. No. 75,626, filed Sept. 14, 1979, now U.S. Pat. No. 4,237,555, issued Dec. 2, '80, whose disclosure is incorporated herein by reference. A typical schematic diagram for network 9 is also disclosed in FIG. 9 of the above-cited co-pending application. A typical schematic diagram of reference amplifier 8 is disclosed in FIG. 12 of the above-cited co-pending application, modified by the elimination of the switching transistors controlled by the output of the switching pulse generator 16 of this co-pending application. A typical schematic diagram of switching pulse generator 13 is disclosed in FIG. 10 of the above-cited co-pending application, modified with respect to the comparison bias applied to the differential amplitude comparators to conform to the switching points of detectors 10–12 and further modified to include the adders, such as ADD 1 and ADD 2, connected as illustrated in FIG. 2.

To ensure the proper input to detectors 10–12, detector 10 is coupled to the output of amplifier 3 by directional coupler 14, with coupler 14 having an attenuation such that the peak signal applied to detector 10 is set closely equal to the maximum signal that the detector can linearly detect. If in some systems the power level of power amplifier 3 is too low to satisfy this requirement then a linear amplifier 34 is added in series with directional coupler 14 so as to produce this power level. For typical good diode detectors the peak amplitude level of the signal fed to detector 10 would be as illustrated in curve 15, with an available peak power of approximately 0.2 watt at a 50 ohm impedance level, i.e.

a peak available power of +23 dbm being fed to detector 10.

Detector 10 will continue to be used down to a level at which its output - input characteristic becomes unacceptable non-linear (usually square law). Typically this non-linear region may start approximately −26 db down from the peak allowable input signal level, or stated another way, detector 10 can successfully linearly detect that range of absolute signal levels between +23 dbm, i.e. 0.2 watt and −3 dbm, i.e. 0.5 milliwatts. Therefore, as curve 15 shows, detector 10 is used in the present example down to an available power level of −3 dbm, i.e. it is used over an agreed-upon linear dynamic range, which in this example is −26 db.

As the signal continues to decrease, the system then switches to detector 11 at the time of occurrence of the lowest level (−3 dbm) of detector 10.

The input for detector 11 is provided by a second directional coupler 16 coupled to the output of linear amplifier 24; or directly to the output of coupler 14 if no linear amplifier is needed as described previously. An RF instantaneous recovery limiting amplifier 17 is coupled between coupler 16 and the input to detector 11. The linear gain of amplifier 17 before it limits must be such that at the lowest-input-level, i.e. −3 dbm in this example, of detector 10, this amplifier will feed to detector 11 a linearly amplified available power which is 26 db higher than the −3 dbm level (therefore +23 dbm in this example). Stated in another way, the resulting linear gain in available power of the combination of coupler 16 and amplifier 17 must equal the agreed upon linear dynamic range over which the detector units are to be used, i.e. 26 db in this example.

Because of the linear 26 db gain in the coupler 16-amplifier 17 combination, the above described −3 dbm to −29 dbm range of signal levels are linearly amplified to a level of +23 dbm to −3 dbm when they are applied to detector 11, which can successfully linearly detect this range of signal levels.

Detector 11 is thus used over that 26 db range covering the −3 dbm to −29 dbm signal levels out of linear amplifier 24 or out of coupler 14 if amplifier 24 is not needed.

Above the output level of +23 dbm the RF instantaneous recovery limiting amplifier 17 becomes non-linear and finally hard-limits at an output level which is typically 3 db above the maximum required linear output level of +23 dbm. This limiting phenomenon is an important practical procedure for protecting the diode detector 11 from destruction by excess input power levels. Curve 18 shows both the levels of that segment of the signal which is to be linearly detected by detector 11, and the amplified levels of this segment as it is actually applied to detector 11.

At the time of occurrence of the lowest level of detector 11, the system then switches to detector 12 at the time of occurrence of the lowest level of detector 11.

Detector 12 receives its input by means of a third directional coupler 19 coupled to the output of amplifier 17, with a second RF instantaneous recovery limiting amplifier 20 being coupled between the output of coupler 19 and the input of detector 12. As with coupler 16 and amplifier 17, the resultant linear gain in available power of the combination of coupler 19 and amplifier 20 must also equal the agreed upon linear dynamic range over which a detector unit properly operates, i.e. 26 db in this example.

Because of this second linear 26 db of gain the −29 dbm to −55 dbm signal level region of the signal from amplifier 24, or directly from coupler 14 if amplifier 24 is not needed, is linearly amplified to a level range of +23 dbm to −3 dbm when applied to detector 12, at which level it can be successfully linearly detected.

Again the limiting characteristic of the second RF instantaneous recovery limiting amplifier 20 that occurs above its required maximum linear output level of +23 dbm, protects diode detector 12 from destruction due to excess input power. Curve 21 shows both the levels of the segment of the signal which is to be linearly detected by detector 12, and the amplified level of this segment as it is actually applied to detector 12.

If additional amplitude detectors are employed, the next amplitude detector rendered operative for yet a lower amplitude range would receive its input signal through a fourth directional coupler 22 and a third RF instantaneous recovery limiting amplifier 23. This arrangement of directional couplers and an RF limiting amplifier would be employed for each additional amplitude detector employed.

Finally to linearly reconstruct the whole signal it is necessary to effectively remove the 26 db gain increments which were needed to make the diode detectors work linearly, and this is accomplished by properly proportioning resistors R1, R2, and R3 which are connected between the outputs of the three diode detectors 10, 11 and 12, and a common low input impedance summing point provided by adder 25. For the 26 db gain increments of this example resistor R2 would be 20 times greater than resistor R1, and resistor R3 would be 20 times greater than resistor R2 in order to obtain linear reconstruction of the signal envelope over a 78 db dynamic range for this present example.

Referring to FIG. 3, a second embodiment of the signal envelope detecting system 5 of the present invention is disclosed in the same transmitters as illustrated in FIG. 1 and would be employed in a feedback loop 4 where it is desired to linearize much further down into the non-linear portion of the non-linear input-output characteristic illustrated in FIG. 1 of power amplifier 3. The components in FIG. 3 that are identical to the components of FIG. 1 are identified by the same reference character as employed in FIG. 1.

Signal envelope detecting system 5 of FIG. 3 includes amplitude detector 26 which is identical to amplitude detector 10 of FIG. 1 and would be rendered operative during the linear portion of the input-output characteristic of amplifier 3 which linear portion is in the amplitude range of 0 db to −26 db below the peak input to detector 26, with the peak input level being approximately 100 milliwatts, i.e. approximately +20 dbm. The other detector of system 5 is a gain controlled amplitude detector 27 which is rendered operative during the non-linear portion of the input-output characteristic of amplifier 3 which occurs in the amplitude range of −26 db to −52 db below peak output. Detector 26 is rendered operative and detector 27 is rendered inoperative during the amplitude range of 0 db to −26 db below peak input to the detector system and detector 27 is rendered operative and detector 26 is rendered inoperative in the amplitude range of −26 db to −52 db below peak input to the detector system by control pulses produced in the on-off switch driver 28 which is controlled by a control pulse produced in the switching pulse generator 13′. As in the embodiment of FIG. 1, generator 13′ compares the amplitude of the reference signal out of network 9 with comparison voltages corresponding to predetermined amplitude levels in voltage comparators so as to produce the proper timing control pulses to appropriately control the gain of detector 27 and the gain of gain controlled reference amplifier 29 simultaneously in the manner fully disclosed in the above-cited co-pending application.

A typical schematic diagram of detector 26 is disclosed in FIG. 6 of the above-cited co-pending application and a typical schematic diagram of detector 27 is illustrated in FIG. 7 of the above-cited co-pending application. A typical schematic diagram for switch driver 28, gain controlled amplifier 29, switching pulse generator 13' and network 9 are illustrated in FIGS. 11, 12, 10 and 9, respectively, of the above-cited co-pending application.

While I have described above the principles of my invention in connection with specific apparatus it is to be clearly understood that this description is made only by way of example and not as a limitation to the scope of my invention as set forth in the objects thereof and in the accompanying claims:

I claim:

1. A signal envelope detecting system for detecting the envelope of a signal requiring accurate reproduction over a large dynamic range comprising:
   a source of said signal;
   a plurality of amplitude detectors coupled to said source, each of said plurality of detectors being responsive to a control signal, said control signal rendering each of said plurality of detectors operative one at a time to detect the amplitude of said signal in a different amplitude range of said signal and holding the others of said plurality of detectors not rendered operative inoperative; and
   means coupled to the output of said plurality of detectors to receive the output signals therefrom.

2. A system according to claim 1, further including
   a control pulse generator coupled to each of said plurality of detectors responsive to the amplitude of a reference signal to generate said control signal in the form of a plurality of control pulses each identifying a different one of said amplitude ranges, each of said plurality of control pulses rendering the appropriate one of said plurality of detectors operative during its associated one of said amplitude ranges and rendering the others of said plurality of detectors inoperative.

3. A system according to claim 2, wherein said control pulse generator includes
   a plurality of voltage comparators equal in number to said plurality of detectors, each of said plurality of comparators and a differencing arrangement coupled thereto generating a different one of said control pulses.

4. A system according to claim 3, further including
   a reference amplifier to amplify and couple said reference signal to said means so that said output signals of said plurality of detectors, when rendered operative, are subtracted from said amplified reference signal.

5. A system according to claim 4, wherein said source includes
   a power amplifier,
   said amplitude ranges number three including an upper amplitude range, a middle amplitude range and a lower amplitude range, and
   said plurality of detectors number three, a first of said three detectors being rendered operative during said upper amplitude range and the others of said three detectors being rendered inoperative, a second of said three detectors being rendered operative during said middle amplitude range and the others of said three detectors being rendered inoperative, and a third of said three detectors being rendered operative during said lower amplitude range and the others of said three detectors being rendered inoperative.

6. A system according to claim 5, further including at least
   a first directional coupler coupled between the output of said power amplifier and the input of said first of said three detectors,
   a second directional coupler coupled to the output of said first coupler,
   a first RF instantaneous recovery limiting amplifier coupled between the output of said second coupler and the input of said second of said three detectors,
   a third directional coupler coupled to the output of said first limiting amplifier, and
   a second RF instantaneous recovery limiting amplifier coupled between the output of said third coupler, and the input of said third of said three detectors.

7. A system according to claim 6, further including
   a linear amplifier coupled between said first coupler and the input of said first of said three detectors.

8. A system according to claim 2, further including
   a reference amplifier to amplify and couple said reference signal to said means so that said output signals of said plurality of detectors, when rendered operative, are subtracted from said amplified reference signal.

9. A system according to claim 8, wherein said source includes
   a power amplifier,
   said amplitude ranges number three including an upper amplitude range, a middle amplitude range and a lower amplitude range, and
   said plurality of detectors number three, a first of said three detectors being rendered operative during said upper amplitude range and the others of said three detectors being rendered inoperative, a second of said three detectors being rendered operative during said middle amplitude range and the others of said three detectors being rendered inoperative, and a third of said three detectors being rendered operative during said lower amplitude range and the others of said three detectors being rendered inoperative.

10. A system according to claim 9, further including at least
    a first directional coupler coupled between the output of said power amplifier and the input of said first of said three detectors,
    a second directional coupler coupled to the output of said first coupler,
    a first RF instantaneous recovery limiting amplifier coupled between the output of said second coupler and the input of said second of said three detectors,
    a third directional coupler coupled to the output of said first limiting amplifier, and
    a second instantaneous recovery limiting amplifier coupled between the output of said third coupler, and the input of said third of said three detectors.

11. A system according to claim 10, further including a linear amplifier coupled between said first coupler and the input of said first of said three detectors.

12. A system according to claim 1, wherein said amplitude ranges include a linear amplitude range and a non-linear amplitude range, and said plurality of detectors number two, one of said two detectors being a gain controlled amplitude detector rendered operative only in said non-linear amplitude range and the other of said two detectors being rendered operative only in said linear amplitude range.

13. A system according to claim 12, further including a control pulse generator coupled to each of said two detectors responsive to the amplitude of a reference signal to generate said control signal in the form of a pair of control pulses and a plurality of additional control pulses, one of said pair of control pulses rendering said other of said two detectors operative only in said linear amplitude range and the other of said pair of control pulses rendering said one of said two detectors operative only in said non-linear amplitude range, and said plurality of additional control pulses controlling the gain of said one of said two detectors at predetermined amplitude levels within said non-linear amplitude range to linearize said non-linear amplitude range.

14. A system according to claim 13, further including a gain controlled reference amplifier to amplify and couple said reference signal to said means so that said output signals of said two detectors, when rendered operative, are subtracted from said amplified reference signal, said reference amplifier being coupled to said control pulse generator responsive to said plurality of additional control pulses to control the gain of said reference amplifier in step with the gain control of said one of said two detectors.

15. A system according to claim 14, wherein said source includes a power amplifier.

16. A system according to claim 15, further including a first directional coupler coupled between the output of said power amplifier and the input of said other of said two detectors, a second directional coupler coupled to the output of said first coupler, and an RF instantaneous recovery limiting amplifier coupled between the output of said second coupler and the input of said gain controlled amplitude detector.

* * * * *